United States Patent
Shin et al.

(10) Patent No.: US 9,975,763 B2
(45) Date of Patent: May 22, 2018

(54) INTEGRATION OF AlN ULTRASONIC TRANSDUCER ON A CMOS SUBSTRATE USING FUSION BONDING PROCESS

(71) Applicant: InvenSense, Inc., San Jose, CA (US)

(72) Inventors: Jong Il Shin, San Jose, CA (US); Peter Smeys, San Jose, CA (US); Jongwoo Shin, Pleasanton, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days. days.

(21) Appl. No.: 15/457,832

(22) Filed: Mar. 13, 2017

(65) Prior Publication Data
US 2017/0275158 A1 Sep. 28, 2017

Related U.S. Application Data

(60) Provisional application No. 62/312,439, filed on Mar. 23, 2016.

(51) Int. Cl.
*B81C 1/00* (2006.01)
*B81B 7/00* (2006.01)
*B06B 1/06* (2006.01)

(52) U.S. Cl.
CPC ............ *B81C 1/00301* (2013.01); *B06B 1/06* (2013.01); *B81B 7/007* (2013.01); *B81B 2201/0271* (2013.01); *B81C 2203/036* (2013.01)

(58) Field of Classification Search
CPC ..... B81C 1/00; B81C 2203/036; B81B 7/007; B81B 2201/0271; B06B 1/06; H01L 41/31; H01L 27/20
See application file for complete search history.

(56) References Cited

U.S. PATENT DOCUMENTS 8,610,336 B1 * 12/2013 Wang .................. H03H 3/0073
310/343
2003/0199105 A1 * 10/2003 Kub .................. H01L 21/76254
438/3

(Continued)

FOREIGN PATENT DOCUMENTS

TW 201517246 A 5/2015
TW 201606849 A 2/2016

OTHER PUBLICATIONS

PCT International Search Report and Written Opinion dated Jun. 23, 2017 in International Application No. PCT/US2017/022201. 12 pages.

*Primary Examiner* — Jay C Chang
*Assistant Examiner* — Charles R Peters
(74) *Attorney, Agent, or Firm* — Duane Morris LLP; Amir A. Tabarrok

(57) ABSTRACT

Provided herein is a method including bonding a first oxide layer on a handle substrate to a second oxide layer on a complementary metal oxide semiconductor ("CMOS"), wherein the fusion bonding forms a unified oxide layer including a diaphragm overlying a cavity on the CMOS. The handle substrate is removed leaving the unified oxide layer. A piezoelectric film stack is deposited over the unified oxide layer. Vias are formed in the piezoelectric film stack and the unified oxide layer. An electrical contact layer is deposited, wherein the electrical contact layer electrically connects the piezoelectric film stack to an electrode on the CMOS.

14 Claims, 8 Drawing Sheets

(56) References Cited

U.S. PATENT DOCUMENTS

| | | | |
|---|---|---|---|
| 2014/0018126 A1* | 1/2014 | Asai | H03H 9/0542 455/550.1 |
| 2014/0232241 A1* | 8/2014 | Hajati | B81B 7/008 310/317 |
| 2015/0298965 A1 | 10/2015 | Tsai et al. | |
| 2015/0357375 A1 | 12/2015 | Tsai et al. | |

* cited by examiner

1200

```
FUSION BONDING A FIRST OXIDE LAYER ON A CMOS TO A SECOND
OXIDE LAYER ON A HANDLE SUBSTRATE, WHEREIN THE FUSION
BONDING FORMS A UNIFIED OXIDE LAYER INCLUDING A DIAPHRAGM
OVERLYING A CAVITY ON THE CMOS
1202
```

```
REMOVING THE HANDLE SUBSTRATE LEAVING THE UNIFIED OXIDE
LAYER
1204
```

```
DEPOSITING A PIEZOELECTRIC FILM STACK OVER THE UNIFIED OXIDE
LAYER
1206
```

```
FORMING VIAS IN THE PIEZOELECTRIC FILM STACK AND THE UNIFIED
OXIDE LAYER
1208
```

```
DEPOSITING AN ELECTRICAL CONTACT LAYER, WHEREIN THE
ELECTRICAL CONTACT LAYER ELECTRICALLY CONNECTS THE
PIEZOELECTRIC FILM STACK TO AN ELECTRODE ON THE CMOS
1210
```

FIG. 12

INTEGRATION OF AlN ULTRASONIC TRANSDUCER ON A CMOS SUBSTRATE USING FUSION BONDING PROCESS

CROSS-REFERENCE TO RELATED APPLICATIONS

This application claims the benefit and priority to the U.S. Provisional Patent Application Ser. No. 62/312,439 filed Mar. 23, 2016, entitled "AlN PMUT SENSOR MODULE INTEGRATION METHOD", which is incorporated by reference in its entirety.

BACKGROUND

Piezoelectric materials convert energy between mechanical energy and electrical energy. A piezoelectric material generates electrical energy when mechanically deformed (e.g. under mechanical stress). On the other hand, a piezoelectric material may mechanically deform in response to electrical energy. For example, a piezoelectric material may vibrate in response to electrical energy, thereby acting as an ultrasonic transducer to generate acoustic waves. Piezoelectric materials may be used in micro-electro-mechanical system ("MEMS") devices, for example, in fingerprint recognition.

SUMMARY

Provided herein is a method including bonding a first oxide layer on a handle substrate to a second oxide layer on a complementary metal oxide semiconductor ("CMOS"), wherein the fusion bonding forms a unified oxide layer including a diaphragm overlying a cavity on the CMOS. The handle substrate is removed leaving the unified oxide layer. A piezoelectric film stack is deposited over the unified oxide layer. Vias are formed in the piezoelectric film stack and the unified oxide layer. An electrical contact layer is deposited, wherein the electrical contact layer electrically connects the piezoelectric film stack to an electrode on the CMOS. These and other features and advantages will be apparent from a reading of the following detailed description.

BRIEF DESCRIPTION OF DRAWINGS

FIG. 12 shows an exemplary flow diagram for an integration of pMUT on CMOS according to one aspect of the present embodiments.

DESCRIPTION

Figure 1:
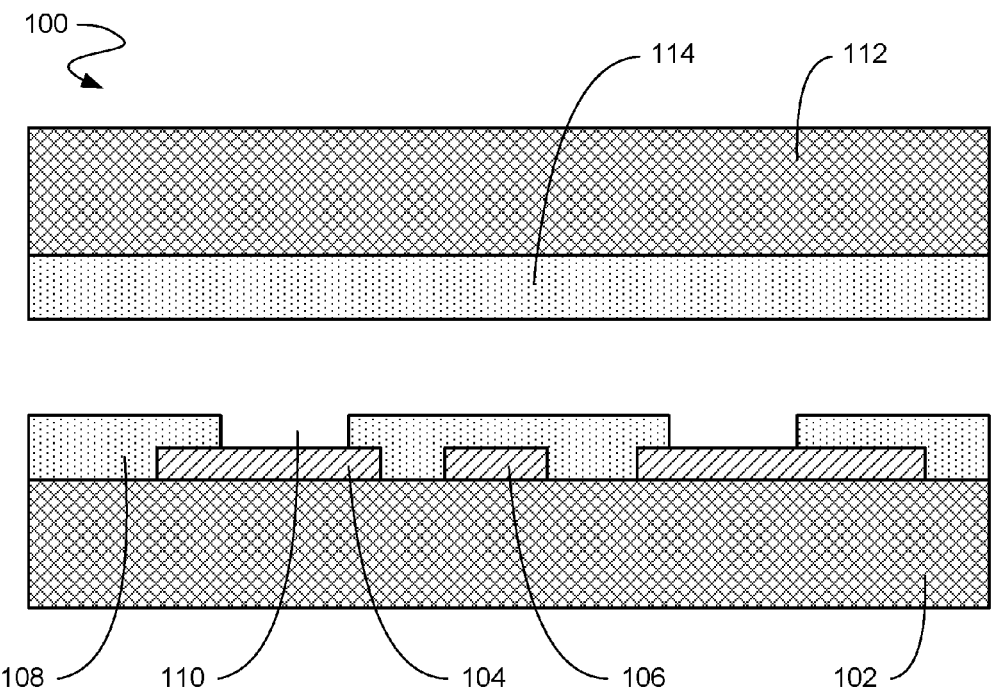
FIG. 1 shows an integrated pMUT on CMOS at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below, " "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Piezoelectric ultrasonic transducers have been miniaturized to form a MEMS device, referred to as a piezoelectric micromachined ultrasonic transducer ("pMUT"). MEMS pMUT wafers may be bonded to CMOS wafers using eutectic bonding method, however such processes can be costly. In addition, integration of CMOS and MEMS pMUT wafers is limited by alignment accuracy tolerances of wafer bonding process. Accordingly, a need has arisen to reduce the cost of CMOS and MEMS pMUT wafer integration, as well as improving alignment tolerances. Embodiments described herein address such needs by integrating a pMUT directly on a CMOS substrate using fusion bonding processes.

Referring now to FIG. 1, an integrated pMUT on CMOS 100 at an early stage of manufacture is shown according to one aspect of the present embodiments. A CMOS substrate 102 has been formed with a first metal electrode 104 and a second metal electrode 106 on the CMOS substrate 102. A first fusion bond oxide 108 is deposited over the CMOS substrate 102, the first metal electrode 104 and the second metal electrode 106. A cavity 110 is formed in the first fusion bond oxide 108, located over the first metal electrode 104. In various embodiments, one or more cavities 110 may be formed over one or more first metal electrodes 104. At this stage of manufacture, the second metal electrode 106 remains covered by the first fusion bond oxide 108. It is understood that the CMOS substrate 102 includes many CMOS structures including, but not limited to, integrated circuit(s), transistor(s), substrate(s), electrical connection(s), metal electrode(s), the fusion bond oxide, etc.

A carrier substrate 112 (e.g. handle substrate) includes a second fusion bond oxide 114. The second fusion bond oxide 114 may be the same material as the first fusion bond oxide 108 or a different material. In various embodiments, the carrier substrate 112 (e.g. handle substrate) and the second fusion bond oxide 114 do not contain any metal, and no features have been formed (e.g. no patterning) in either the carrier substrate 112 or the second fusion bond oxide 114.

Figure 2:
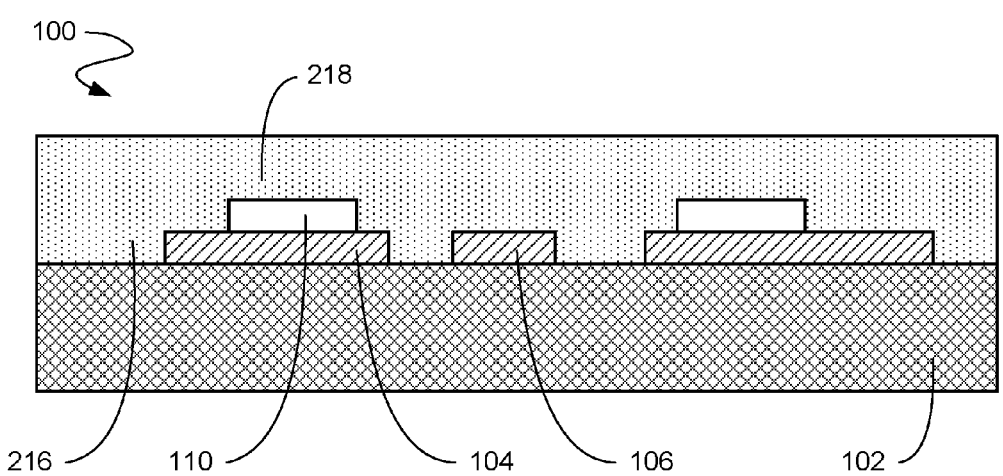
FIG. 2 shows the integrated pMUT on CMOS after fusion bonding and removal of the carrier substrate according to one aspect of the present embodiments.

Referring now to FIG. 2, the integrated pMUT on CMOS 100 after fusion bonding and removal of the carrier substrate 112 is shown according to one aspect of the present embodiments. The first fusion bond oxide 108 and the second fusion bond oxide 114 have been fusion bonded together to form a unified oxide layer 216. The unified oxide layer 216 encloses the cavity 110, thereby forming a membrane 218 (e.g. diaphragm) over the cavity 110 and a portion of the first metal electrode 104. After the fusion bonding and formation of the unified oxide layer 216, the carrier substrate 112 is removed (e.g. by grinding, etching, etc.) leaving the unified oxide layer 216 over the CMOS substrate 102.

Figure 3:
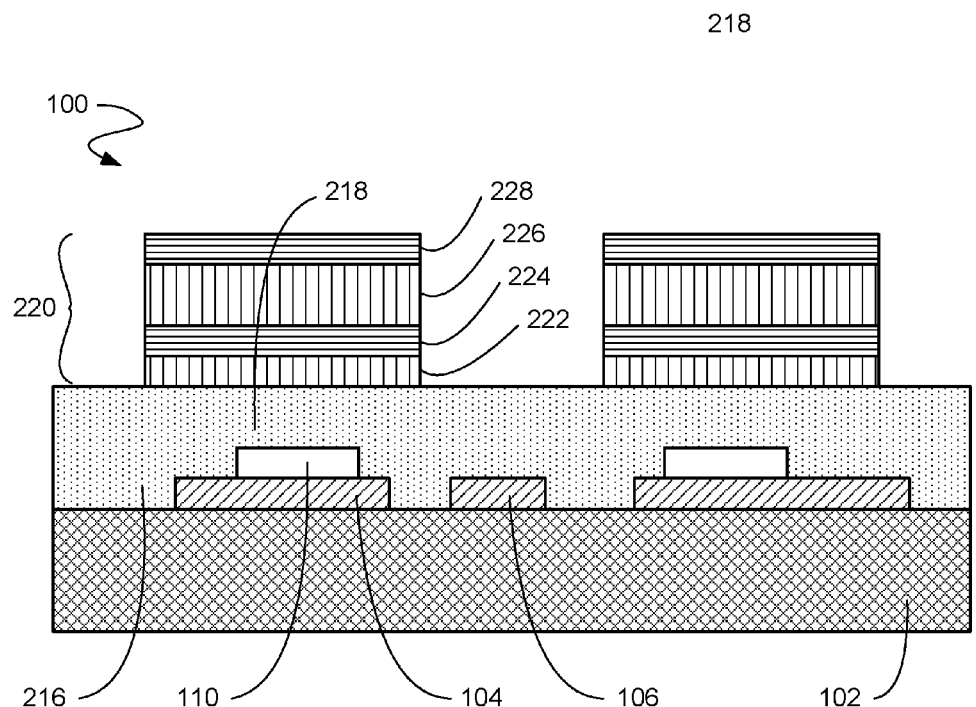
FIG. 3 shows the integrated pMUT on CMOS after piezoelectric film stack deposition and patterning according to one aspect of the present embodiments.

Referring now to FIG. 3, the integrated pMUT on CMOS 100 after piezoelectric film stack 220 deposition and patterning is shown according to one aspect of the present embodiments. The piezoelectric film stack 220 includes a seed layer 222 (e.g. aluminum nitride) overlying the unified oxide layer 216, a first metal layer 224 (e.g. molybdenum) overlying the seed layer 222, a piezoelectric layer 226 (e.g. aluminum nitride) overlying the first metal layer 224, and a second metal layer 228 (e.g. molybdenum) overlying the piezoelectric layer 226. In various embodiments, the piezoelectric film stack 220 includes aluminum nitride, lead zirconate titanate, zinc oxide, polyvinylidene difluoride, and/or lithium niobate.

After layer deposition, the piezoelectric film stack 220 is patterned and formed, resulting in at least a portion of the piezoelectric film stack 220 remaining over the first metal electrode 104. In various embodiments, the piezoelectric film stack 220 does not overly the second metal electrode 106 after patterning. As such, the piezoelectric film stack 220 is over the cavity 110, the membrane 218 (e.g. diaphragm), and the unified oxide layer 216 (e.g. the first fusion bond oxide 108 and the second fusion bond oxide 114 fusion bonded together).

Figure 4:
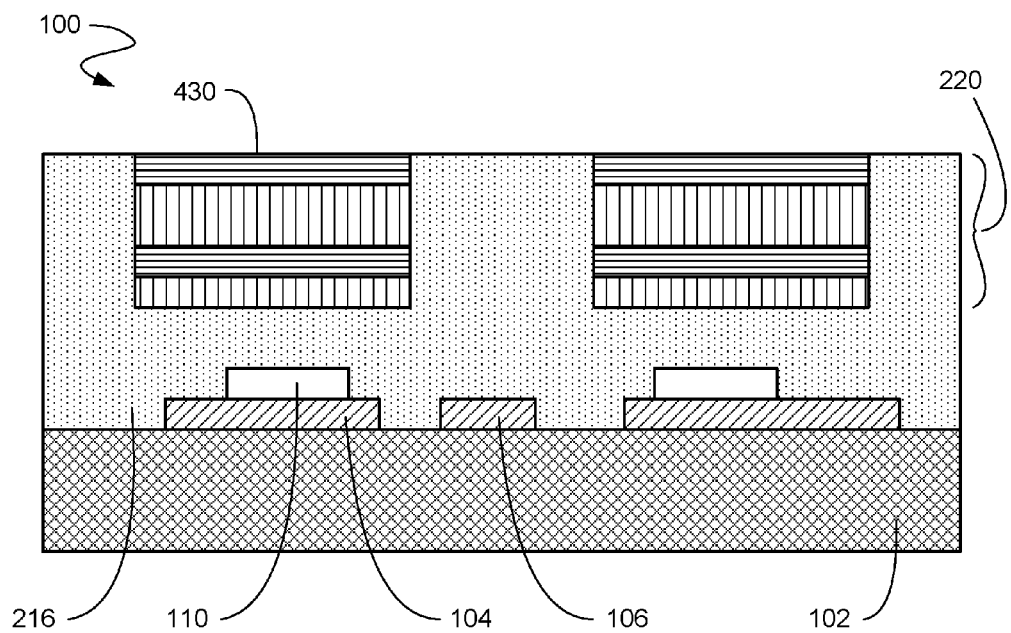
FIG. 4 shows the integrated pMUT on CMOS after gap fill oxide has been deposited and planarized according to one aspect of the present embodiments.

Referring now to FIG. 4, the integrated pMUT on CMOS 100 after gap fill oxide has been deposited and planarized is shown according to one aspect of the present embodiments. Additional oxide (e.g. gap fill oxide) has been added to the unified oxide layer 216 and planarized. In various embodiments, the gap fill oxide is deposited subsequent to patterning the piezoelectric film stack 220. As a result the unified oxide layer 216 surrounds the piezoelectric film stack 220, leaving a top surface 430 of the piezoelectric film stack 220 exposed and free of the unified oxide layer 216.

Figure 5:
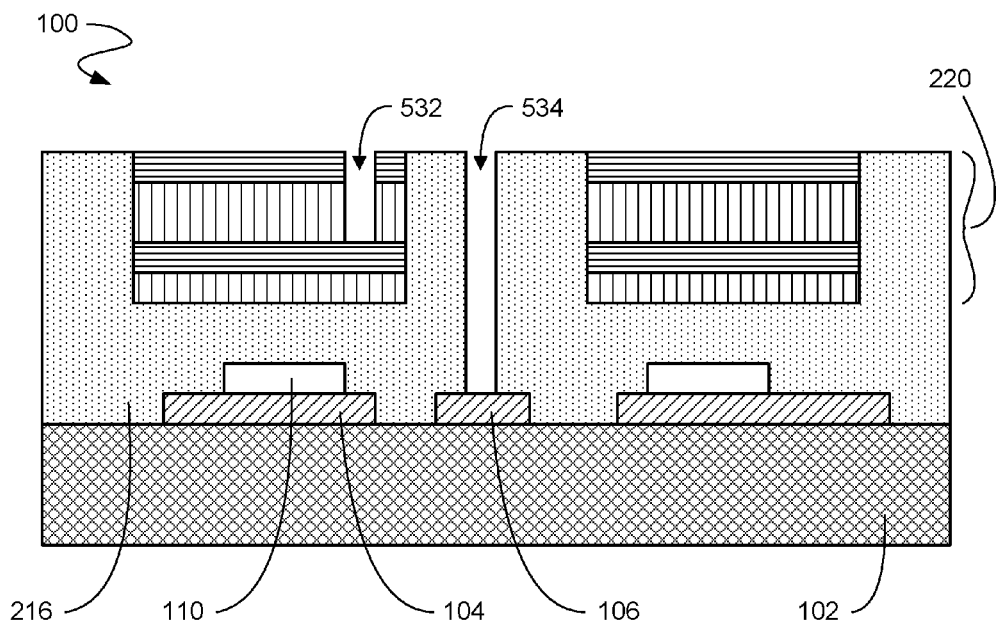
FIG. 5 shows the integrated pMUT on CMOS after formation of a first electrical contact via and a second electrical contact via according to one aspect of the present embodiments.

Referring now to FIG. 5, the integrated pMUT on CMOS 100 after formation of a first electrical contact via 532 and a second electrical contact via 534 is shown according to one aspect of the present embodiments. In various embodiments, the first electrical contact via 532 is formed (e.g. etched) into the piezoelectric film stack 220. In addition, the second electrical contact via 534 is formed (e.g. etched) into the unified oxide layer 216 down to the second metal electrode 106.

Figure 6:
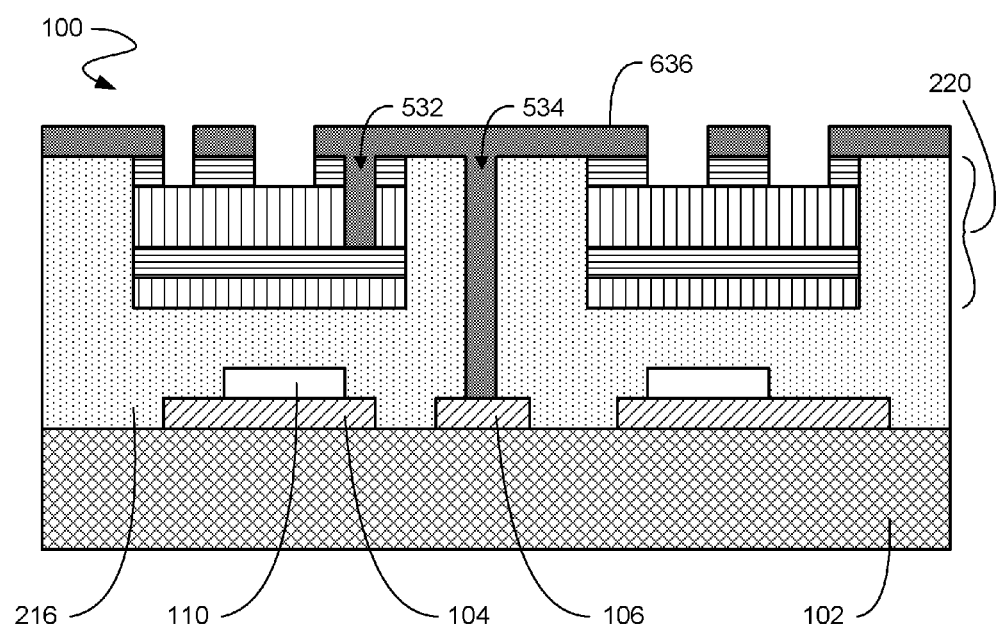
FIG. 6 shows the integrated pMUT on CMOS after deposition and patterning of an electrical contact layer according to one aspect of the present embodiments.

Referring now to FIG. 6, the integrated pMUT on CMOS 100 after deposition and patterning of an electrical contact layer 636 is shown according to one aspect of the present embodiments. The electrical contact layer 636 is deposited over the unified oxide layer 216 and the piezoelectric film stack 220. The electrical contact layer 636 fills the first electrical contact via 532 and the second electrical contact via 534, thereby electrically connecting the piezoelectric film stack 220 to the second metal electrode 106 on the CMOS substrate 102. In various embodiments, the electrical contact layer 636 and the piezoelectric film stack 220 are patterned. Such patterning defines electrical connections from the piezoelectric film stack 220 to one or more electrodes (e.g. first metal electrode 104, second metal electrode 106, and/or other metal electrodes). As a result of the fusion bonding and layer depositions described above, the top and bottom electrode of piezoelectric film stack 220 is electrically connected to the electrodes on the CMOS substrate 102 without a eutectic bond.

As a result of the integrated pMUT on CMOS fabrication described above, expensive eutectic bonding processes (e.g. Al—Ge eutectic bonding) can be avoided. In addition, process throughput can be improved by removing the relatively lengthy eutectic bonding process. The fusion bonding process described above addresses these concerns by reducing expense and improving process throughput.

In addition, the fusion bonding process described above uses silicon oxide. As a result, cost is reduced by removing the use of silicon on insulator or polysilicon on insulator substrates used in eutectic bonding.

Furthermore, the fusion bonding process described above does not rely on the accuracy of wafer-to-wafer bonding processes. Instead the wafers are bonded together prior to patterning, resulting in improved alignment accuracy between defined features.

Figure 7:
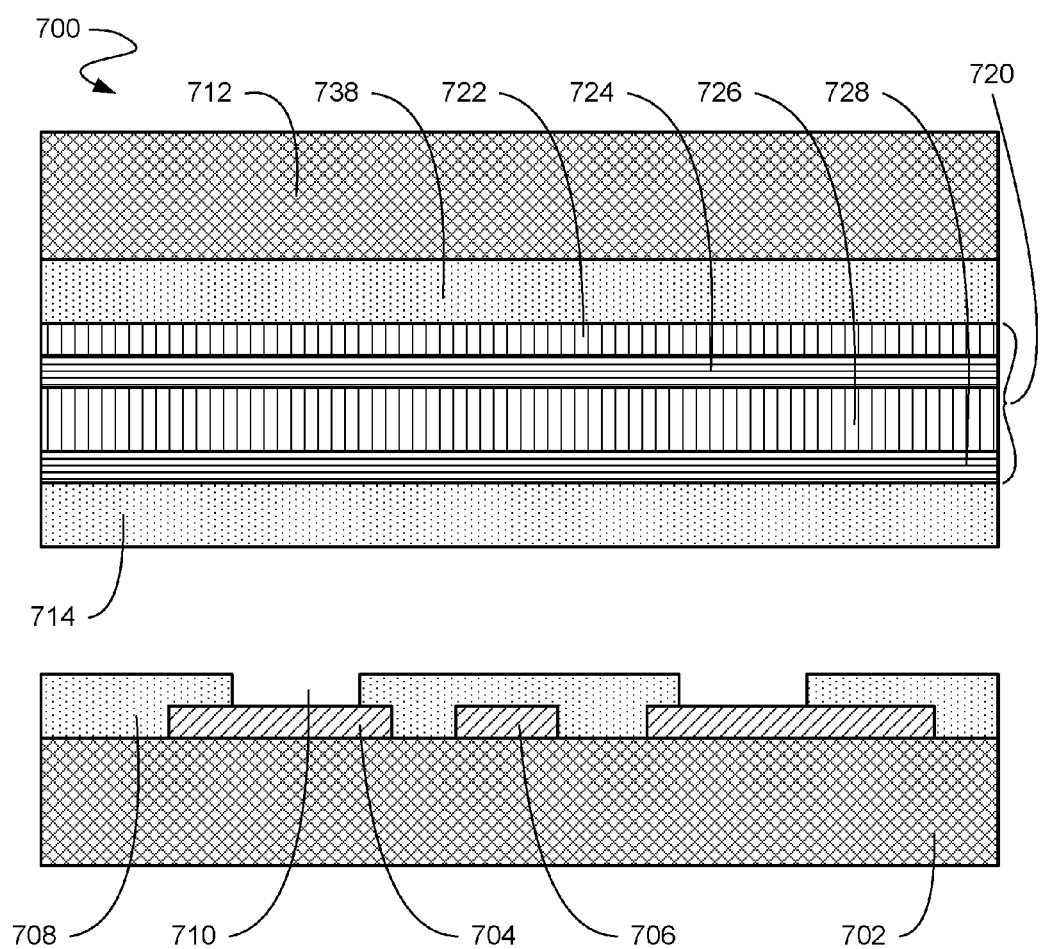
FIG. 7 shows another integrated pMUT on CMOS at an early stage of manufacture according to one aspect of the present embodiments.

Referring now to FIG. 7, an integrated pMUT on CMOS 700 at an early stage of manufacture is shown according to one aspect of the present embodiments. A CMOS substrate 702 has been formed with a first metal electrode 704, a second metal electrode 706, and a first fusion bond oxide 708. A cavity 710 is formed in the first fusion bond oxide 708. The cavity 710 is formed over the first metal electrode 704. In various embodiments, one or more cavities 710 may be formed over one or more first metal electrodes 704. At this stage of manufacture, the second metal electrode 706 remains covered by the fusion bond oxide 708. It is understood that the CMOS substrate 702 includes many CMOS structures including, but not limited to, integrated circuit(s), transistor(s), substrate(s), electrical connection(s), metal electrode(s), the fusion bond oxide, etc.

A stop oxide layer 738 is formed on a carrier substrate 712 (e.g. handle substrate). A piezoelectric film stack 720 is formed on the stop oxide layer 738 and includes a seed layer 722 (e.g. aluminum nitride) on the stop oxide layer 738, a first metal layer 724 (e.g. molybdenum) on the seed layer 722, a piezoelectric layer 726 (e.g. aluminum nitride) on the first metal layer 724, and a second metal layer 728 (e.g. molybdenum) on the piezoelectric layer 226. In various embodiments, the piezoelectric film stack 720 includes aluminum nitride, lead zirconate titanate, zinc oxide, polyvinylidene difluoride, and/or lithium niobate.

A second fusion bond oxide 714 is formed on the second metal layer 728 of the piezoelectric film stack 720. The second fusion bond oxide 714 may be the same material as the first fusion bond oxide 708 or a different material. In various embodiments, no features have been formed in either the carrier substrate 712 or the second fusion bond oxide 714.

Figure 8:
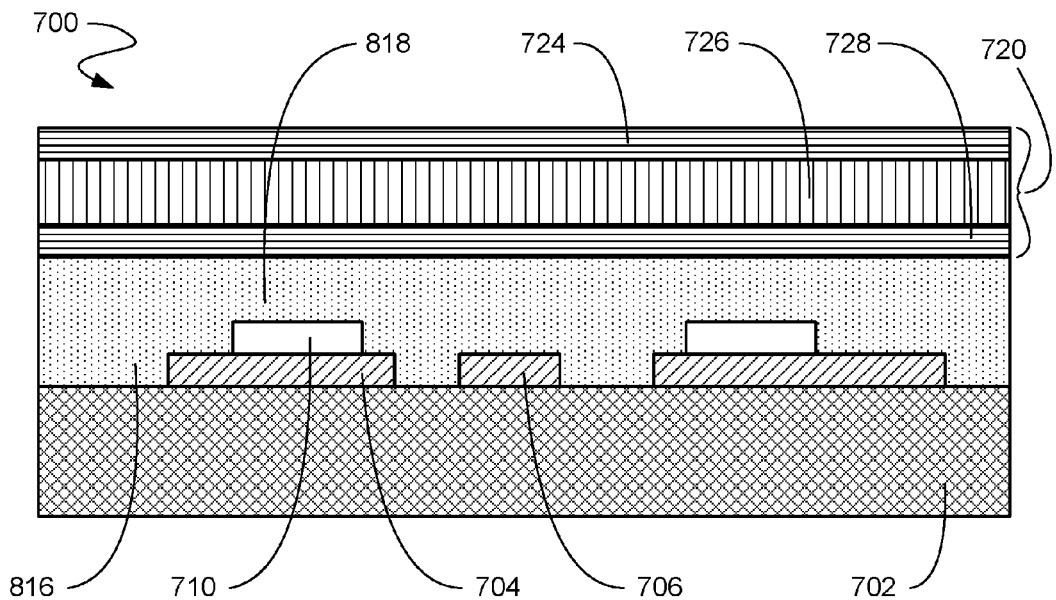
FIG. 8 shows the integrated pMUT on CMOS after fusion bonding and removal of the carrier substrate according to one aspect of the present embodiments.

Referring now to FIG. 8, the integrated pMUT on CMOS 700 after fusion bonding and removal of the carrier substrate 712 is shown according to one aspect of the present embodiments. The first fusion bond oxide 708 and the second fusion bond oxide 714 have been fusion bonded together to form a unified oxide layer 816. The unified oxide layer 816 encloses the cavity 710 and forms a membrane 818 (e.g. diaphragm) over the cavity 710 and a portion of the first metal electrode 704. After the fusion bonding and formation of the unified oxide layer 816, the carrier substrate 712 and the stop oxide layer 738 are removed (e.g. by grinding, etching, etc.).

The removal leaves the piezoelectric film stack 720 including the first metal layer 724, the piezoelectric layer 726, and the second metal layer 728. The first metal layer 724 is over the piezoelectric layer 726. The piezoelectric layer 726 is over the second metal layer 728. The second metal layer 728 is over the unified oxide layer 816 (e.g. the first fusion bond oxide 708 and the second fusion bond oxide 714 fusion bonded together).

Figure 9:
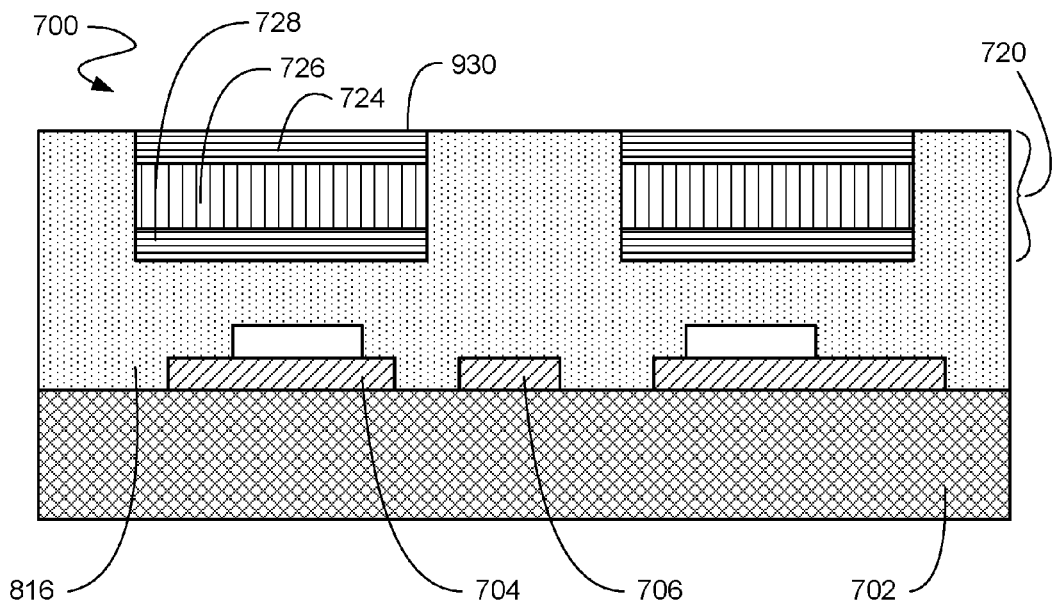
FIG. 9 shows the integrated pMUT on CMOS after piezoelectric film stack patterning and deposition of gap fill oxide according to one aspect of the present embodiments.

Referring now to FIG. 9, the integrated pMUT on CMOS 700 after piezoelectric film stack 720 patterning and deposition of gap fill oxide is shown according to one aspect of the present embodiments. The piezoelectric film stack 720 is patterned and formed (e.g. by etching), resulting in at least a portion of the piezoelectric film stack 720 remaining over the first metal electrode 704, the cavity 710, the membrane 818 (e.g. diaphragm), and the unified oxide layer 816 (e.g. the first fusion bond oxide 708 and the second fusion bond oxide 714 fusion bonded together). In various embodiments, the piezoelectric film stack 720 does not overly the second metal electrode 706 after patterning.

After the patterning of the piezoelectric film stack 720, additional oxide (e.g. gap fill oxide) has been deposited and added to the unified oxide layer 816 and planarized. In various embodiments, the gap fill oxide is deposited subsequent to depositing and patterning the piezoelectric film stack 720. As a result the unified oxide layer 816 surrounds the piezoelectric film stack 720, leaving a top surface 930 of the piezoelectric film stack 720 exposed and free of the unified oxide layer 816.

Figure 10:
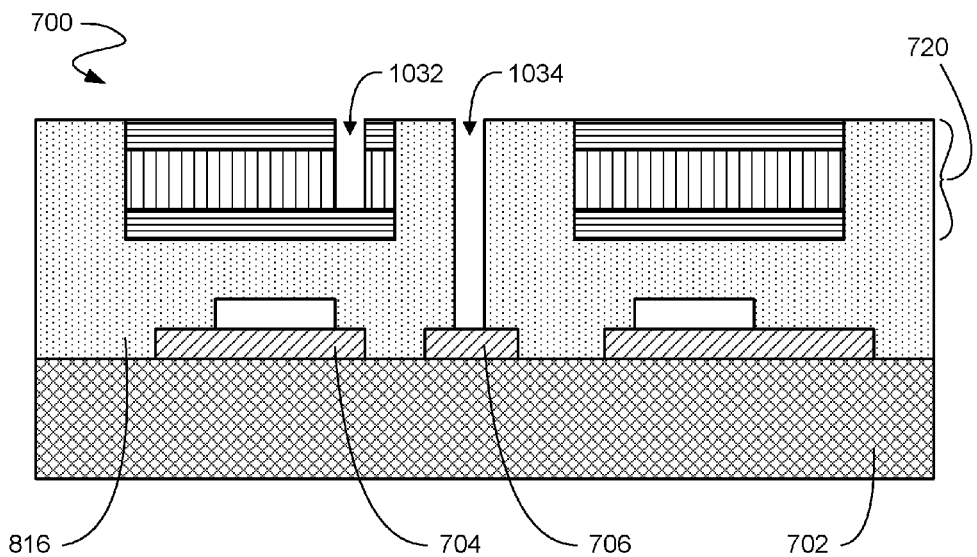
FIG. 10 shows the integrated pMUT on CMOS after formation of a first electrical contact via and a second electrical contact via according to one aspect of the present embodiments.

Referring now to FIG. 10, the integrated pMUT on CMOS 700 after formation of a first electrical contact via 1032 and a second electrical contact via 1034 is shown according to one aspect of the present embodiments. In various embodiments, the first electrical contact via 1032 is formed (e.g. etched) into the piezoelectric film stack 720. In addition, the second electrical contact via 1034 is formed (e.g. etched) into the unified oxide layer 816 down to the second metal electrode 706.

Figure 11:
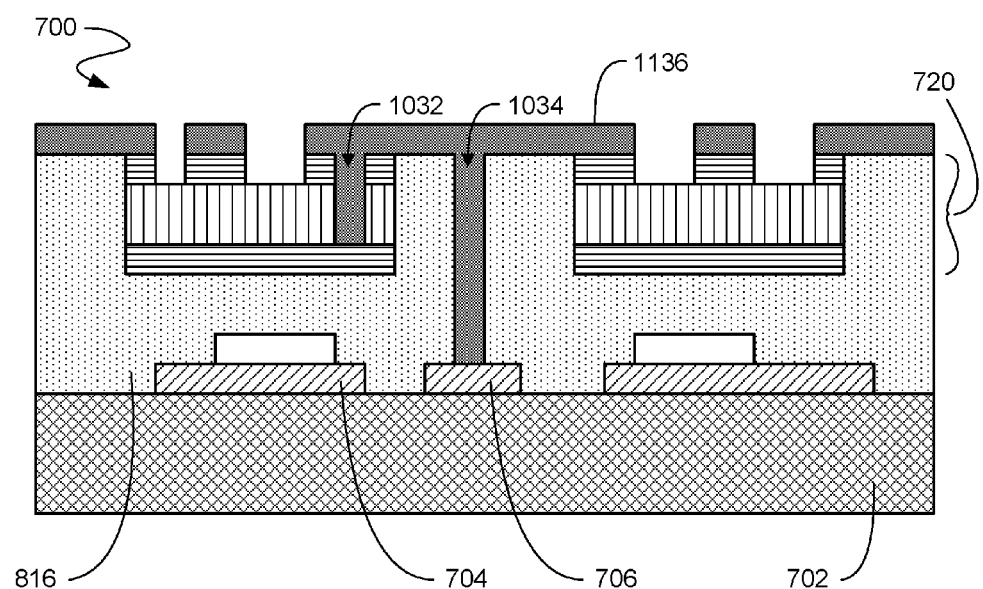
FIG. 11 shows the integrated pMUT on CMOS after deposition and patterning of an electrical contact layer according to one aspect of the present embodiments.

Referring now to FIG. 11, the integrated pMUT on CMOS 700 after deposition and patterning of an electrical contact layer 1136 is shown according to one aspect of the present embodiments. The electrical contact layer 1136 is deposited over the unified oxide layer 816 and the piezoelectric film stack 720. The electrical contact layer 1136 fills the first electrical contact via 1032 and the second electrical contact via 1034, thereby electrically connecting the piezoelectric film stack 720 to the second metal electrode 706 on the CMOS substrate 702. In various embodiments, the electrical contact layer 1136 and the piezoelectric film stack 720 are patterned. Such patterning defines electrical connections from the piezoelectric film stack 720 to one or more electrodes (e.g. first metal electrode 704, second metal electrode 706, and/or other metal electrodes). As a result of the fusion bonding and layer depositions described above, the top and bottom electrodes of piezoelectric film stack 720 is electrically connected to the electrodes on the CMOS substrate 702 without a eutectic bond.

As a result of the integrated pMUT on CMOS fabrication described above, expensive eutectic bonding processes (e.g. Al—Ge eutectic bonding) can be avoided. In addition, process throughput can be improved by removing the relatively lengthy eutectic bonding process. The fusion bonding process described above addresses these concerns by reducing expense and improving process throughput.

In addition, the fusion bonding process described above uses silicon oxide. As a result, cost is reduced by removing the use of silicon on insulator or polysilicon on insulator substrates used in eutectic bonding.

Furthermore, the fusion bonding process described above does not rely on the accuracy of wafer-to-wafer bonding processes. Instead the wafers are bonded together prior to patterning, resulting in improved alignment accuracy between defined features.

FIG. 12 shows an exemplary flow diagram 1200 for the integration of pMUT on CMOS according to one aspect of the present embodiments. At block 1202, a first oxide layer on a handle substrate is fusion bonded to a second oxide layer on a CMOS, wherein the fusion bonding forms a unified oxide layer including a diaphragm overlying a cavity on the CMOS. For example, in FIGS. 1 and 2 the second fusion bond oxide on the carrier substrate is fusion bonded to the first fusion bond oxide. The fusion bonding forms the unified oxide layer that encloses the cavity, thereby forming a membrane (e.g. diaphragm) over the cavity on the CMOS.

In some embodiments, the handle substrate and the first oxide layer do not include any metal. For example, in FIG. 1 the carrier substrate (e.g. handle substrate) and the second fusion bond oxide do not contain any metal. In various embodiments, the fusion bonding occurs prior to any patterning of the second oxide layer. For example, in FIG. 1 no features have been formed (e.g. no patterning) in either the carrier substrate or the second fusion bond oxide.

At block 1204, the handle substrate is removed leaving the unified oxide layer. For example, in FIG. 2 the carrier substrate is removed (e.g. by grinding, etching, etc.) leaving the unified oxide layer over the CMOS substrate.

At a block 1206, a piezoelectric film stack is deposited over the unified oxide layer. For example, in FIG. 3 the piezoelectric film stack is deposited over the unified oxide layer. In some embodiments, the piezoelectric film stack includes the seed layer deposited over the unified oxide layer, the first metal layer deposited over the seed layer, the piezoelectric layer deposited over the first metal layer, and the second metal layer deposited over the piezoelectric layer. In various embodiments, the seed layer and the piezoelectric layer include aluminum nitride. In further embodiments, the first metal layer and the second metal layer include molybdenum.

In some embodiments, a gap fill oxide is deposited subsequent to depositing the piezoelectric film stack over the unified oxide layer. For example, in FIG. 4 additional oxide (e.g. gap fill oxide) has been added to the unified oxide layer and planarized subsequent to depositing and patterning the piezoelectric film stack.

At a block 1208, vias are formed in the piezoelectric film stack and the unified oxide layer. For example, in FIG. 5 the first electrical contact via is formed (e.g. etched) into the piezoelectric film stack. In addition, the second electrical contact via is formed (e.g. etched) into the unified oxide layer down to the second metal electrode.

At a block 1210, an electrical contact layer is deposited, wherein the electrical contact layer electrically connects the piezoelectric film stack to an electrode on the CMOS. For example, in FIG. 6 the electrical contact layer fills the first electrical contact via and the second electrical contact via, thereby electrically connecting the piezoelectric film stack to the second metal electrode on the CMOS.

Figure 13:
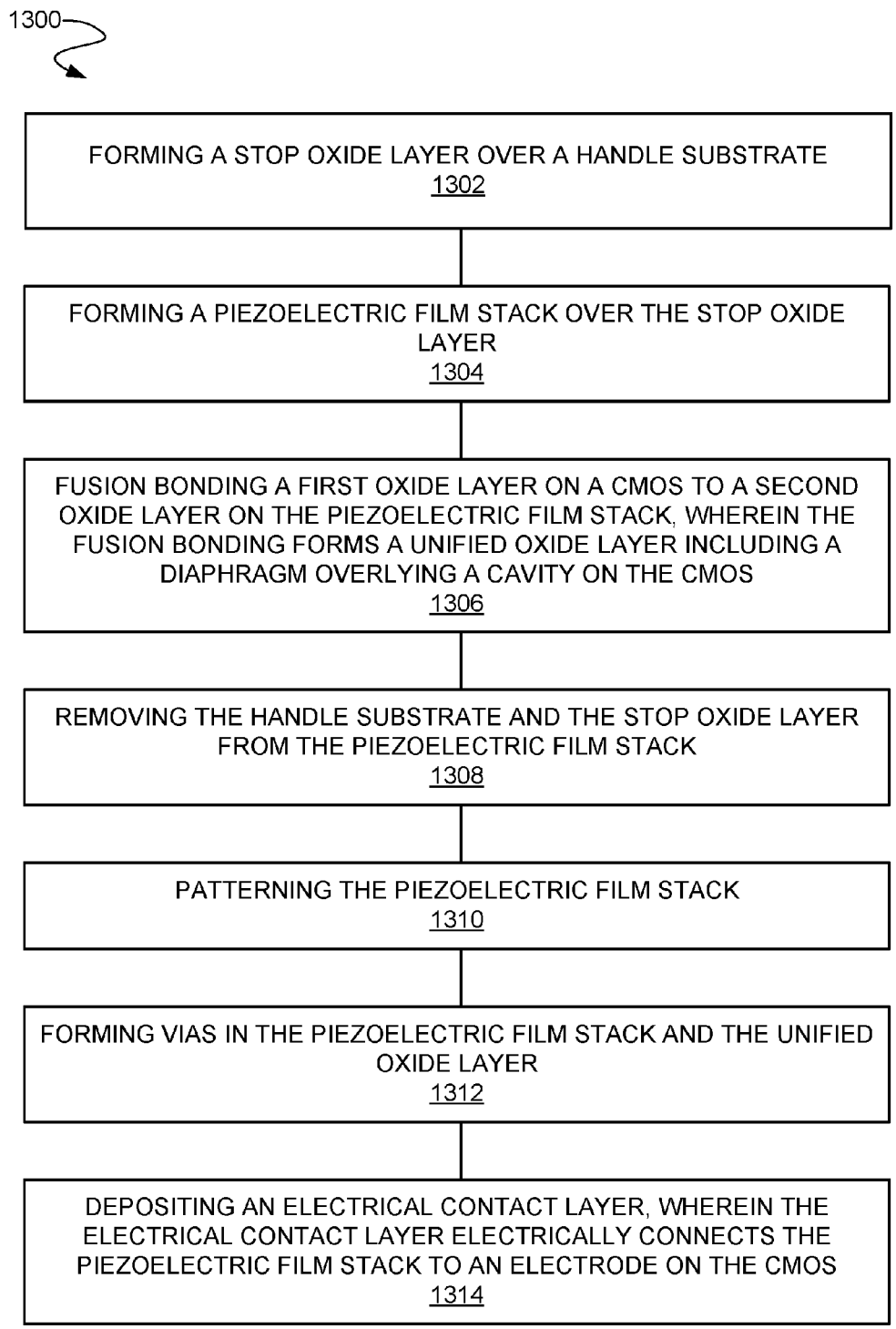
FIG. 13 shows an exemplary flow diagram for another integration of pMUT on CMOS according to one aspect of the present embodiments.

FIG. 13 shows an exemplary flow diagram 1300 for the integration of pMUT on CMOS according to one aspect of the present embodiments. At block 1302, a stop oxide layer is formed over a handle substrate. For example, in FIG. 7 a stop oxide layer is formed on a carrier substrate (e.g. handle substrate).

At block 1304, a piezoelectric film stack is formed over the stop oxide layer. For example, in FIG. 7 a piezoelectric film stack is formed over the stop oxide layer and includes a seed layer deposited over the stop oxide layer, a first metal layer deposited over the seed layer, a piezoelectric layer deposited over the first metal layer, and a second metal layer deposited over the piezoelectric layer. In various embodiments, the piezoelectric film stack includes aluminum nitride, lead zirconate titanate, zinc oxide, polyvinylidene difluoride, and/or lithium niobate.

At a block 1306, a first oxide layer on a CMOS is fusion bonded to a second oxide layer on the piezoelectric film stack, wherein the fusion bonding forms a unified oxide layer including a diaphragm overlying a cavity on the CMOS. For example, in FIG. 8 the first fusion bond oxide on the CMOS and the second fusion bond oxide on the piezoelectric film stack have been fusion bonded together to form a unified oxide layer. The unified oxide layer encloses the cavity and forms a membrane (e.g. diaphragm) over the cavity.

At a block 1308, the handle substrate and the stop oxide layer are removed from the piezoelectric film stack. For example, in FIG. 8 the carrier substrate and the stop oxide layer are removed (e.g. by grinding, etching, etc.).

At a block 1310, the piezoelectric film stack is patterned. For example, in FIG. 9 the piezoelectric film stack is patterned and formed (e.g. by etching). In some embodiments, a gap fill oxide is deposited and planarized subsequent to patterning the piezoelectric film stack. For example, in FIG. 9 after the patterning of the piezoelectric film stack, additional oxide (e.g. gap fill oxide) has been deposited and added to the unified oxide layer and planarized. In various embodiments, the gap fill oxide is deposited subsequent to depositing and patterning the piezoelectric film stack.

In some embodiments, the fusion bonding occurs prior to the patterning of the piezoelectric film stack. For example, in FIGS. 8 and 9 the first fusion bond oxide and the second fusion bond oxide have been fusion bonded together to form a unified oxide layer. Thereafter, the piezoelectric film stack is patterned and formed (e.g. by etching), resulting in at least a portion of the piezoelectric film stack remaining over the unified oxide layer (e.g. the first fusion bond oxide and the second fusion bond oxide fusion bonded together).

At a block 1312, vias are formed in the piezoelectric film stack and the unified oxide layer. For example, in FIG. 10 the first electrical contact via is formed (e.g. etched) into the piezoelectric film stack. In addition, the second electrical contact via is formed (e.g. etched) into the unified oxide layer down to the second metal electrode.

At a block 1314, an electrical contact layer is deposited, wherein the electrical contact layer electrically connects the top and bottom electrodes of piezoelectric film stack to the electrodes on the CMOS. For example, in FIG. 11 the electrical contact layer fills the first electrical contact via and the second electrical contact via, thereby electrically connecting the top and bottom electrodes of piezoelectric film stack to the metal electrodes on the CMOS substrate.

In some embodiments, the piezoelectric film stack is electrically connected to the CMOS without eutectic bonding. For example, in FIG. 11 the electrical contact layer electrically connects the top and bottom electrodes of piezoelectric film stack to the metal electrodes on the CMOS substrate. As a result of the fusion bonding and layer depositions described above, the top and bottom electrodes piezoelectric film stack is electrically connected to the electrodes on the CMOS substrate without a eutectic bond.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   fusion bonding a first oxide layer on a complementary metal oxide semiconductor (CMOS) to a second oxide layer on a handle substrate, wherein the fusion bonding forms a unified oxide layer including a diaphragm overlying a cavity on the CMOS;
   removing the handle substrate leaving the unified oxide layer;
   depositing a piezoelectric film stack over the unified oxide layer;
   forming vias in the piezoelectric film stack and the unified oxide layer; and depositing an electrical contact layer, wherein the electrical contact layer electrically connects the piezoelectric film stack to an electrode on the CMOS.

2. The method of claim 1, wherein depositing the piezoelectric film stack includes:
   depositing a seed layer over the unified oxide layer;
   depositing a first metal layer over the seed layer;
   depositing a piezoelectric layer over the first metal layer; and
   depositing a second metal layer over the piezoelectric layer.

3. The method of claim 2, wherein
   the seed layer and the piezoelectric layer include aluminum nitride, and
   the first metal layer and the second metal layer include molybdenum.

4. The method of claim 1, further comprising depositing a gap fill oxide subsequent to the depositing the piezoelectric film stack over the unified oxide layer.

5. The method of claim 4, further comprising planarizing the gap fill oxide.

6. The method of claim 1, wherein the handle substrate and the second oxide layer do not include any metal.

7. The method of claim 1, wherein the fusion bonding occurs prior to any patterning of the second oxide layer.

8. A method comprising:
   forming a stop oxide layer over a handle substrate;
   forming a piezoelectric film stack over the stop oxide layer;
   fusion bonding a first oxide layer on a complementary metal oxide semiconductor (CMOS) to a second oxide layer on the piezoelectric film stack, wherein the fusion bonding forms a unified oxide layer including a diaphragm overlying a cavity on the CMOS;
   removing the handle substrate and the stop oxide layer from the piezoelectric film stack;
   patterning the piezoelectric film stack;
   forming vias in the piezoelectric film stack and the unified oxide layer; and
   depositing an electrical contact layer, wherein the electrical contact layer electrically connects the piezoelectric film stack to an electrode on the CMOS.

9. The method of claim 8, wherein depositing the piezoelectric film stack includes:
   depositing a seed layer over the stop oxide layer;
   depositing a first metal layer over the seed layer;
   depositing a piezoelectric layer over the first metal layer; and
   depositing a second metal layer over the piezoelectric layer.

10. The method of claim 8, wherein the piezoelectric film stack includes aluminum nitride, lead zirconate titanate, zinc oxide, polyvinylidene difluoride, or lithium niobate.

11. The method of claim 8, further comprising depositing a gap fill oxide subsequent to the patterning the piezoelectric film stack.

12. The method of claim 11, further comprising planarizing the gap fill oxide.

13. The method of claim 8, wherein the fusion bonding occurs prior to the patterning of the piezoelectric film stack.

14. The method of claim 8, wherein the piezoelectric film stack is electrically connected to the CMOS without eutectic bonding.

* * * * *